United States Patent
Lai et al.

(10) Patent No.: US 8,471,284 B2
(45) Date of Patent: Jun. 25, 2013

(54) LED PACKAGE STRUCTURE AND FABRICATION METHOD THEREOF

(75) Inventors: Chieh-Lung Lai, Taichung (TW); Chih-Sheng Hsu, Taichung (TW); Chang-Yueh Chan, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 228 days.

(21) Appl. No.: 13/021,861

(22) Filed: Feb. 7, 2011

(65) Prior Publication Data

US 2012/0168777 A1  Jul. 5, 2012

(30) Foreign Application Priority Data

Dec. 31, 2010  (TW) .............................. 99147156 A

(51) Int. Cl.
*H01L 33/00* (2010.01)
(52) U.S. Cl.
USPC ........ 257/98; 257/99; 257/100; 257/E33.056; 257/E33.058; 257/E33.059; 257/E33.061
(58) Field of Classification Search
USPC .............. 257/98, 99, 100, E33.056, E33.058, 257/E33.059, E33.061
See application file for complete search history.

(56) References Cited

U.S. PATENT DOCUMENTS

| 7,564,180 | B2 | 7/2009 | Brandes | |
| 7,679,281 | B2* | 3/2010 | Kim et al. | 313/501 |
| 2005/0233485 | A1* | 10/2005 | Shishov et al. | 438/25 |
| 2009/0050907 | A1* | 2/2009 | Yuan et al. | 257/88 |
| 2010/0219428 | A1* | 9/2010 | Jung et al. | 257/89 |
| 2011/0084612 | A1* | 4/2011 | Ratcliffe et al. | 315/112 |
| 2011/0163338 | A1* | 7/2011 | Won | 257/98 |
| 2011/0210360 | A1* | 9/2011 | Negley et al. | 257/98 |
| 2012/0235200 | A1* | 9/2012 | Thompson et al. | 257/98 |
| 2012/0241781 | A1* | 9/2012 | Yuan et al. | 257/89 |

* cited by examiner

*Primary Examiner* — Victor A Mandala
(74) *Attorney, Agent, or Firm* — Edwards Wildman Palmer LLP; Peter F. Corless; Steven M. Jensen

(57) ABSTRACT

An LED package structure includes: a carrier; at least a first protruding portion and a plurality of electrical contacts formed on the carrier; a plurality of LED chips disposed on the first protruding portion and on the carrier in a region free from the first protruding portion, respectively; a plurality of bonding wires electrically connecting the LED chips and the electrical contacts; and a phosphor covering the LED chips, the electrical contacts and the bonding wires. The LED chips are disposed at different heights so as to allow the portions of the phosphor on the LED chips to have different thicknesses and thus generate light with different color temperatures.

10 Claims, 3 Drawing Sheets

US 8,471,284 B2

LED PACKAGE STRUCTURE AND FABRICATION METHOD THEREOF

CROSS-REFERENCES TO RELATED APPLICATIONS

This application claims under 35 U.S.C. §119(a) the benefit of Taiwanese Application No. 099147156, filed Dec. 31, 2010, the entire contents of which is incorporated herein by reference.

BACKGROUND OF THE INVENTION

1. Field of the Invention

The present invention relates to package structures and fabrication methods thereof, and more particularly, to a light emitting diode (LED) package structure and a fabrication method thereof.

2. Description of Related Art

Since LEDs have advantages of long lifetime, low power consumption and short response time and do not have idling time, the application of the LEDs is increasingly expanded. Particularly, LEDs of different colors have been developed and widely adopted in lighting applications, and conventional cold cathode bulbs, halogen bulbs or incandescent bulbs are being replaced by the LEDs so as to meet the energy saving and carbon reducing trend.

Currently, LED structures with adjustable color temperatures have been developed to extend the application of the LEDs. As disclosed by U.S. Pat. No. 7,564,180, one method for achieving such a structure involves using LEDs of at least two different colors in combination with at least a type of phosphor, which, however, results in a complicated fabrication process and high cost.

FIG. 1 shows a conventional LED structure with adjustable color temperature. Referring to FIG. 1, a carrier 10 having two recesses 100a, 100b is provided, wherein each of the recesses 100a, 100b has electrical contacts 11 and a silver paste layer 12 formed on the bottom thereof. LED chips 13 of the same type are disposed on the silver paste layers 12 in the recesses 110a, 100b and electrically connected to the corresponding electrical contacts 11 through bonding wires 14, respectively. Then, phosphors 15a, 15b of two or more different color temperatures are coated on the LED chips 13 in the recesses 100a, 100b, respectively, and the luminous intensity of the LED chips 13 is adjusted so as to emit light of different color temperatures.

However, the above-described fabrication process requires a plurality of recesses and needs to coat the phosphors at least two times, thereby complicating the fabrication process and increasing the fabrication cost and the package size.

Therefore, there is a need to provide an LED package structure and a fabrication method thereof so as to overcome the above-described drawbacks.

SUMMARY OF THE INVENTION

Accordingly, the present invention provides an LED package structure, which comprises: a carrier; at least a first protruding portion and a plurality of electrical contacts formed on the carrier; a plurality of LED chips disposed on the first protruding portion and on the carrier in a region without the first protruding portion, respectively; a plurality of bonding wires electrically connecting the LED chips and the electrical contacts; and a phosphor covering the LED chips, the electrical contacts and the bonding wires.

The above-described package structure can further comprise at least a second protruding portion formed on the carrier and having a height different from the first protruding portion, allowing the LED chips to be disposed on the first protruding portion and the second protruding portion, respectively.

The present invention further provides a fabrication method of an LED package structure, which comprises the steps of: providing a carrier having at least a first protruding portion and a plurality of electrical contacts formed thereon; disposing a plurality of LED chips on the first protruding portion and on the carrier in a region without the first protruding portion, respectively; electrically connecting the LED chips and the electrical contacts through a plurality of bonding wires; and covering the LED chips, the electrical contacts and the bonding wires with a phosphor.

In the above-described fabrication method, at least a second protruding portion is further formed on the carrier and has a height different from the first protruding portion, allowing the LED chips to be disposed on the first protruding portion and the second protruding portion, respectively.

The present invention only requires a single type of LED chips and a single type of phosphor. By disposing the LED chips of the same type on the first protruding portion and the second protruding portion of different heights, the portions of the phosphor on the LED chips have different thicknesses so as to emit light with different color temperatures. Therefore, the present invention eliminates the need of multi-color LED chips and multi-color phosphor and does not need to apply the phosphor for several times as in the prior art, thereby simplifying the fabrication process, improving the fabrication efficiency and reducing the fabrication cost.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "one", "above", "top", "bottom" etc. are merely for illustrative purpose and should not be construed to limit the scope of the present invention.

First Embodiment

Figure 1:
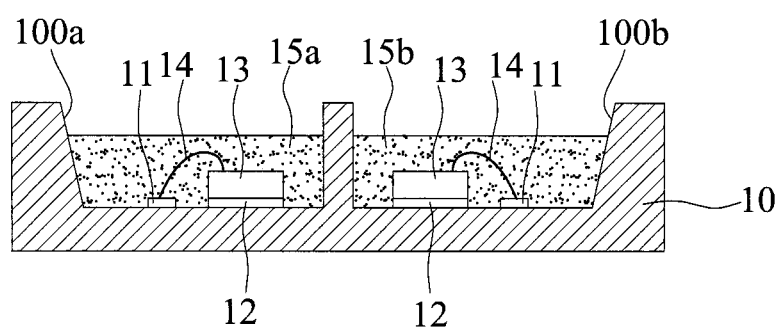
FIG. 1 is a cross-sectional view of a conventional LED package structure.
Figure 2A:
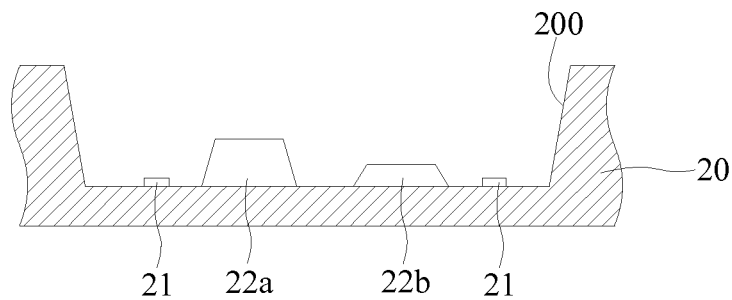
FIGS. 2A to 2C are cross-sectional views showing an LED package structure and a fabrication method thereof according to a first embodiment of the present invention, wherein FIG. 2C' is another embodiment of FIG. 2C.
Figure 2B:
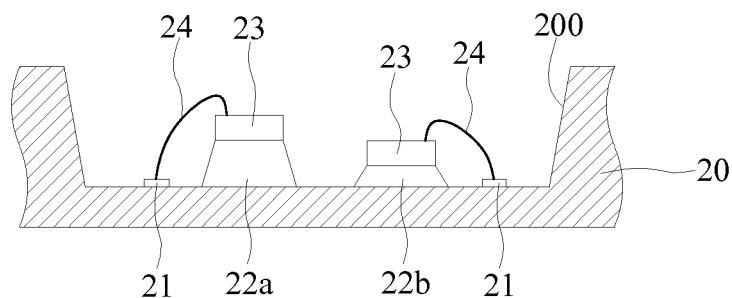
Figure 2C:
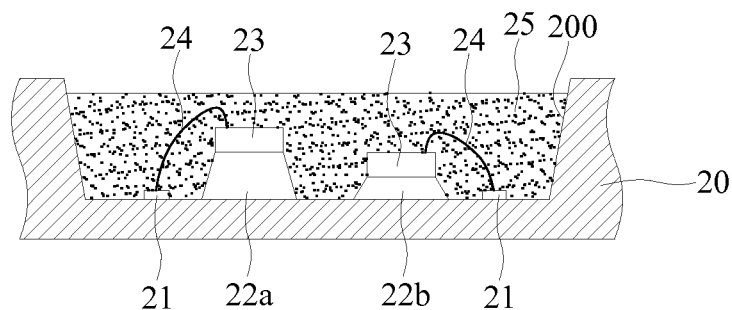
Figure 2C:
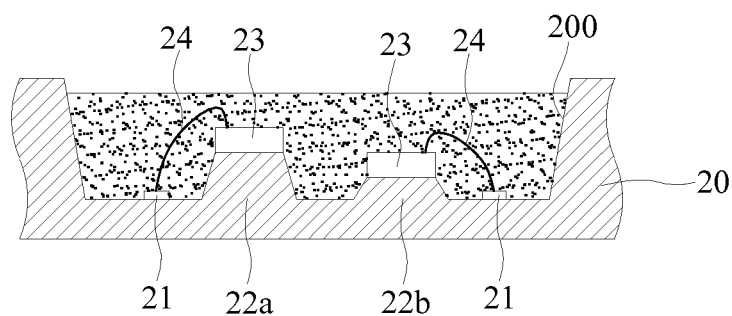

FIGS. 2A to 2C are cross-sectional views showing an LED package structure and a fabrication method thereof according to a first embodiment of the present invention, wherein FIG. 2C' is another embodiment of FIG. 2C. Referring to FIG. 2A, a carrier 20 having a recess 200 is provided. At least a first protruding portion 22a, at least a second protruding portion 22b and a plurality of electrical contacts 21 are formed on the bottom of the recess 200, wherein the first protruding portion 22a has a height different from that of the second protruding portion 22b. Each of the first and second protruding portions 22a, 22b can be a silver paste layer, a solder paste layer or a stiffener. In another embodiment, the carrier 20 does not have the recess 200, and the first protruding portion 22a and the electrical contacts 21 are directly formed on the carrier 20 (not shown).

Referring to FIG. 2B, a plurality of LED chips 23 is disposed on the first protruding portion 22a and the second protruding portion 22b, respectively, and electrically connected to the electrical contacts 21 through a plurality of bonding wires 24. The LED chips 23 can be blue LED chips, green LED chips, red LED chips, orange LED chips, yellow LED chips, purple LED chips or infrared LED chips.

Referring to FIG. 2C, a phosphor 25 is filled in the recess 200 to cover the LED chips 23, the electrical contacts 21 and the bonding wires 24. Therein, the phosphor 25 can be a blue phosphor, a green phosphor, a red phosphor, an orange phosphor, a yellow phosphor, a purple phosphor or an infrared phosphor.

In another embodiment, the first protruding portion 22a and the second protruding portion 22b can be a portion of the carrier 20 and the final structure is shown in FIG. 2C'. Since the fabrication method of such a package structure can be easily understood by those skilled in the art, detailed description thereof is omitted herein.

Second Embodiment

Figure 3:
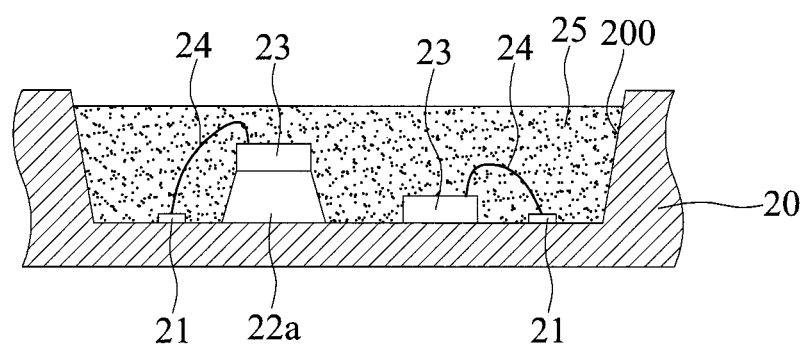
FIG. 3 is a cross-sectional view showing an LED package structure according to a second embodiment of the present invention.

FIG. 3 is a cross-sectional view of an LED package structure according to a second embodiment of the present invention. The present embodiment is similar to the first embodiment. A main difference therebetween is that the package structure of the second embodiment only has a first protruding portion 22a and does not have a second protruding portion. As such, a plurality of LED chips 23 is disposed on the first protruding portion 22a and on the carrier 20, respectively. The fabrication method of the present embodiment is substantially similar to the first embodiment and detailed description thereof is omitted herein.

The present invention further provides an LED package structure having a carrier 20; at least a first protruding portion 22a and a plurality of electrical contacts 21 formed on the carrier 20; a plurality of LED chips 23 disposed on the first protruding portion 22a and on the carrier 20 in a region free from the first protruding portion 22a, respectively; a plurality of bonding wires 24 electrically connecting the LED chips 23 and the electrical contacts 21; and a phosphor 25 covering the LED chips 23, the electrical contacts 21 and the bonding wires 24.

In the above-described LED package structure, the carrier 20 can have a recess 200, wherein the first protruding portion 22a and the electrical contacts 21 are formed on the bottom of recess 200, and the phosphor 25 is further filled in the recess 200.

The LED package structure can further comprise at least a second protruding portion 22b formed on the carrier 20 and having a height different from that of the first protruding portion 22a, wherein the LED chips 23 are disposed on the first protruding portion 22a and the second protruding portion 22b, respectively.

In the above-described LED package structure, the LED chips 23 can be blue LED chips, green LED chips, red LED chips, orange LED chips, yellow LED chips, purple LED chips or infrared LED chips.

In the above-described LED package structure, each of the first and second protruding portions 22a, 22b can be a silver paste layer, a solder paste layer, a stiffener or a portion of the carrier 20.

In the above-described LED package structure, the phosphor 25 can be a blue phosphor, a green phosphor, a red phosphor, an orange phosphor, a yellow phosphor, a purple phosphor or an infrared phosphor.

As known from experiments, an LED chip in combination with different amounts of phosphor produces light of different color temperatures. For example, the combination of a blue LED chip and an appropriate amount of yellow phosphor produces white light; if the amount of the phosphor is less than the appropriate amount, the combination produces blue light; otherwise, if the amount of the phosphor is greater than the appropriate amount, the combination produces yellow-white light.

Therefore, a plurality of LED chips of the same color can be disposed at different heights so as to allow the amounts (thicknesses) of the portions of the phosphor on the LED chips to be different, thereby emitting light of different colors (different color temperatures).

The present invention only requires a single type of LED chips and a single type of phosphor. By disposing the LED chips of the same type on the first protruding portion and the second protruding portion of different heights (or thicknesses), the portions of the phosphor on the LED chips have different thicknesses so as to emit light of different color temperatures. Therefore, the present invention eliminates the need of multi-color LED chips and multi-color phosphor and does not need to apply the phosphor for several times as in the prior art, thereby simplifying the fabrication process, improving the fabrication efficiency and reducing the fabrication cost.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. An LED package structure, comprising:
   a carrier having a recess;
   at least a first protruding portion and a plurality of electrical contacts formed on a bottom of the recess of the carrier;
   a plurality of LED chips disposed on the first protruding portion;
   a plurality of bonding wires electrically connecting the LED chips and the electrical contacts; and
   a phosphor filled in the recess and covering the LED chips, the electrical contacts and the bonding wires.

2. The structure of claim 1, further comprising at least a second protruding portion formed on the carrier and having a height different from the first protruding portion, for the LED chips to be disposed on the first protruding portion and the second protruding portion, respectively.

3. The structure of claim 2, wherein the second protruding portion is a silver paste layer, a solder paste layer, a stiffener or a portion of the carrier.

4. The structure of claim 1, wherein the LED chips are blue LED chips, green LED chips, red LED chips, orange LED chips, yellow LED chips, purple LED chips or infrared LED chips.

5. The structure of claim 1, wherein the first protruding portion is a silver paste layer, a solder paste layer, a stiffener or a portion of the carrier.

6. The structure of claim 1, wherein the phosphor is a blue phosphor, a green phosphor, a red phosphor, an orange phosphor, a yellow phosphor, a purple phosphor or an infrared phosphor.

7. A fabrication method of an LED package structure, comprising the steps of:

providing a carrier having a recess, and at least a first protruding portion and a plurality of electrical contacts formed on a bottom of the recess;

disposing a plurality of LED chips on the first protruding portion;

electrically connecting the LED chips and the electrical contacts through a plurality of bonding wires; and filling a phosphor in the recess and covering the LED chips, the electrical contacts and the bonding wires with the phosphor.

8. The method of claim 7, wherein at least a second protruding portion is further formed on the carrier and has a height different from the first protruding portion, such that the LED chips are disposed on the first protruding portion and the second protruding portion, respectively.

9. The method of claim 7, wherein the LED chips are blue LED chips, green LED chips, red LED chips, orange LED chips, yellow LED chips, purple LED chips or infrared LED chips.

10. The method of claim 7, wherein the phosphor is a blue phosphor, a green phosphor, a red phosphor, an orange phosphor, a yellow phosphor, a purple phosphor or an infrared phosphor.

* * * * *